United States Patent
Tanaka et al.

(10) Patent No.: US 7,259,940 B2
(45) Date of Patent: Aug. 21, 2007

(54) THIN-FILM MAGNETIC HEAD, HEAD GIMBAL ASSEMBLY, AND HARD DISK DRIVE

(75) Inventors: Kosuke Tanaka, Tokyo (JP); Koji Shimazawa, Tokyo (JP); Koichi Terunuma, Tokyo (JP); Tomoaki Shimizu, Tokyo (JP)

(73) Assignee: TDK Corporation, Tokyo (JP)

( * ) Notice: Subject to any disclaimer, the term of this patent is extended or adjusted under 35 U.S.C. 154(b) by 458 days.

(21) Appl. No.: 10/889,053

(22) Filed: Jul. 13, 2004

(65) Prior Publication Data

US 2005/0013063 A1    Jan. 20, 2005

(30) Foreign Application Priority Data

Jul. 14, 2003  (JP) ............................. 2003-274310

(51) Int. Cl.
   *G11B 5/33*    (2006.01)
   *G11B 5/39*    (2006.01)
(52) U.S. Cl. .............................. 360/324.12; 360/324.1; 428/811; 428/811.2
(58) Field of Classification Search ............ 360/324.1, 360/324.11, 324.12; 428/811–811.5
   See application file for complete search history.

(56) References Cited

U.S. PATENT DOCUMENTS

| | | | | |
|---|---|---|---|---|
| 5,992,004 A * | 11/1999 | Sato et al. | ................ | 29/603.14 |
| 5,995,338 A * | 11/1999 | Watanabe et al. | ...... | 360/324.12 |
| 6,118,624 A | 9/2000 | Fukuzawa et al. | | |
| 6,157,526 A | 12/2000 | Watanabe et al. | | |
| 6,172,859 B1 | 1/2001 | Watanabe et al. | | |
| 6,707,649 B2 * | 3/2004 | Hasegawa et al. | ..... | 360/324.12 |
| 6,862,159 B2 * | 3/2005 | Hasegawa | .............. | 360/324.11 |
| 7,016,164 B2 * | 3/2006 | Gill | ........................ | 360/324.11 |
| 2001/0014000 A1 * | 8/2001 | Tanaka et al. | ......... | 360/324.12 |
| 2001/0040781 A1 * | 11/2001 | Tanaka et al. | ......... | 360/324.12 |
| 2002/0075722 A1 * | 6/2002 | Ooshima | ............... | 360/324.12 |
| 2003/0048585 A1 * | 3/2003 | Gill | ........................ | 360/324.12 |
| 2003/0063415 A1 * | 4/2003 | Hasegawa et al. | ..... | 360/324.11 |
| 2004/0008455 A1 * | 1/2004 | Hasegawa et al. | ..... | 360/324.12 |
| 2004/0047087 A1 * | 3/2004 | Fukui et al. | ............ | 360/324.12 |
| 2005/0068694 A1 * | 3/2005 | Nakabayashi et al. | . | 360/324.11 |
| 2005/0238924 A1 * | 10/2005 | Gill | ............................. | 428/837 |
| 2005/0275975 A1 * | 12/2005 | Zhang et al. | .......... | 360/324.12 |
| 2006/0132989 A1 * | 6/2006 | Zhang et al. | .......... | 360/324.12 |

FOREIGN PATENT DOCUMENTS

| | | |
|---|---|---|
| CN | 1150292 A | 5/1997 |
| JP | A 10-154314 | 6/1998 |
| JP | A10-312512 | 11/1998 |
| JP | A10-312514 | 11/1998 |
| JP | A 2002-324307 | 11/2002 |

* cited by examiner

*Primary Examiner*—Andrea Wellington
*Assistant Examiner*—Jason M. Garr
(74) *Attorney, Agent, or Firm*—Oliff & Berridge, PLC

(57) ABSTRACT

A pair of domain control layers are disposed on both sides of the track width direction of the MR film so as to be separated from each other such that the MR film is held therebetween, and apply a longitudinal magnetic field to the MR film (free layer). The MR film is flanked by the domain control layers, each including a layer structure constituted by a base layer, a ferromagnetic layer, and a hard magnetic layer. The base layer causes the hard magnetic layer to have a magnetization direction aligning with an in-plane direction, so as to enhance the coercive force of the hard magnetic layer.

8 Claims, 12 Drawing Sheets

Fig.10

| | HARD MAGNETIC LAYER (THICKNESS) | FERROMAGNETIC LAYER | BASE LAYER (THICKNESS) | BHN OCCURRENCE RATIO |
|---|---|---|---|---|
| EVALUATION EXAMPLE 1 | $CoCr_5Pt_{15}$ (25nm) | $FeCo_{10}$ | $CrTi_{15}$ (2nm) | 0.13 |
| EVALUATION EXAMPLE 2 | $CoCr_5Pt_{15}$ (25nm) | $FeCo_{10}$ | $TiW_{75}$ (2nm) | 0.23 |
| EVALUATION EXAMPLE 3 | $CoCr_5Pt_{15}$ (25nm) | $FeCo_{10}$ | $CrMo_{20}$ (2nm) | 0.55 |
| EVALUATION EXAMPLE 4 | $CoCr_5Pt_{15}$ (25nm) | $FeCo_{10}$ | $CrW_{20}$ (2nm) | 0.24 |

THIN-FILM MAGNETIC HEAD, HEAD GIMBAL ASSEMBLY, AND HARD DISK DRIVE

BACKGROUND OF THE INVENTION

1. Field of the Invention

The present invention relates to a thin-film magnetic head, a head gimbal assembly, and a hard disk drive.

2. Related Background of the Invention

As magnetic recording media such as hard disks increase their density, thin-film magnetic heads are required to improve their performances. Thin-film magnetic heads encompass reproducing heads including a magnetoresistive device (hereinafter referred to as MR device) for reading. As a characteristic of a reproducing head, it is required that Barkhausen noise be low. For reducing Barkhausen noise, hard magnetic layers are disposed so as to hold the MR device therebetween, and a bias magnetic field is applied to the MR device, such that a free layer included in the MR device is turned into a single domain.

Meanwhile, for responding to a further higher magnetic recording density, reproducing heads are required to further narrow their gaps and tracks. However, narrowing the gaps and tracks makes it harder to apply the bias magnetic field effectively to the MR device. In particular, as the track width becomes narrower, Barkhausen noise is more likely to occur. For suppressing the occurrence of Barkhausen noise, it has been known to provide a bias magnetic field applying film for applying a bias magnetic field to an MR device as a laminate film composed of a hard magnetic layer (made of a hard magnetic material containing Co, such as CoPt alloy or CoCrPt alloy) and a highly magnetically saturated magnetic layer (made of FeCo alloy), so as to enhance the saturation magnetization of the bias magnetic field applying film as a whole (see, for example, Patent Document 1: Japanese Patent Application Laid-Open No. HEI 10-312512, and Patent Document 2: Japanese Patent Application Laid-Open No. HEI 10-312514).

SUMMARY OF THE INVENTION

However, the laminate film composed of a hard magnetic layer and a highly magnetically saturated magnetic layer exhibits a low coercive force, thus still leaving a possibility of Barkhausen noise occurring.

In view of the foregoing, it is an object of the present invention to provide a thin-film magnetic head which can further effectively suppress the occurrence of Barkhausen noise, and a head gimbal assembly and a hard disk drive which are equipped with the thin-film magnetic head.

The thin-film magnetic head in accordance with the present invention comprises a magnetoresistive film and a pair of domain control layers, disposed on both sides in a track width direction of the magnetoresistive film while being separated from each other, for applying a bias magnetic field to the magnetoresistive film; wherein the domain control layers include a layer structure constituted by a hard magnetic layer, a ferromagnetic layer, and a base layer for causing the hard magnetic layer to have a magnetization direction aligning with an in-plane direction.

In the thin-film magnetic head in accordance with the present invention, since the domain control layers include the layer structure constituted by the hard magnetic layer, ferromagnetic layer, and base layer, the base layer causes the hard magnetic layer to have a magnetization direction aligning with an in-plane direction. This can enhance the coercive force of the hard magnetic layer, thereby further effectively suppressing the occurrence of Barkhausen noise.

The in-plane direction is a direction (intersecting the laminating direction of the layer structure) within a plane extending along the hard magnetic layer. The bias magnetic field may be a longitudinal bias magnetic field.

Preferably, the ferromagnetic layer is laminated between the hard magnetic layer and base layer in the layer structure. Such a configuration can further enhance the coercive force of the hard magnetic layer.

Preferably, the base layer includes a material having a body-centered cubic structure. Such a configuration allows the hard magnetic layer to grow while its magnetization direction aligns with an in-plane direction when forming the hard magnetic layer.

Preferably, the base layer includes a metal selected from the group consisting of Ti, Cr, Mo, W, and alloys thereof. Such a configuration allows the hard magnetic layer to grow while its magnetization direction aligns with an in-plane direction when forming the hard magnetic layer.

Preferably, the base layer has a maximum film thickness set within the range of 1 to 3 nm. Such a configuration can suppress the occurrence of Barkhausen noise quite effectively.

The head gimbal assembly in accordance with the present invention comprises a support, a thin-film magnetic head formed on the support, and a gimbal for securing the support; wherein the thin-film magnetic head comprises a magnetoresistive film and a pair of domain control layers, disposed on both sides in a track width direction of the magnetoresistive film while being separated from each other, for applying a bias magnetic field to the magnetoresistive film; wherein the domain control layers include a layer structure constituted by a hard magnetic layer, a ferromagnetic layer, and a base layer for causing the hard magnetic layer to have a magnetization direction aligning with an in-plane direction.

Since the thin-film magnetic head has the domain control layers, the head gimbal assembly in accordance with the present invention can further effectively suppress the occurrence of Barkhausen noise as mentioned above.

The hard disk drive in accordance with the present invention comprises a support, a thin-film magnetic head formed on the support, and a recording medium opposing the thin-film magnetic head; wherein the thin-film magnetic head comprises a magnetoresistive film and a pair of domain control layers, disposed on both sides in a track width direction of the magnetoresistive film while being separated from each other, for applying a bias magnetic field to the magnetoresistive film; and wherein the domain control layers include a layer structure constituted by a hard magnetic layer, a ferromagnetic layer, and a base layer for causing the hard magnetic layer to have a magnetization direction aligning with an in-plane direction.

Since the thin-film magnetic head has the domain control layers, the hard disk drive in accordance with the present invention can further effectively suppress the occurrence of Barkhausen noise as mentioned above.

BRIEF DESCRIPTION OF THE DRAWINGS

FIG. 10 is a table showing configurations of domain control layers included in thin-film magnetic heads in accordance with Evaluation Examples 1 to 4 and their characteristics;

DESCRIPTION OF THE PREFERRED EMBODIMENTS

The thin-film magnetic head, head gimbal assembly, and hard disk drive in accordance with preferred embodiments of the present invention will be explained with reference to the drawings. In the explanation, constituents identical to each other or those having functions identical to each other will be referred to with characters identical to each other without repeating their overlapping descriptions. The words "upper" and "lower" conform to the upper and lower sides in each of FIGS. 1, 2, and 5 to 8, respectively.

Figure 1:
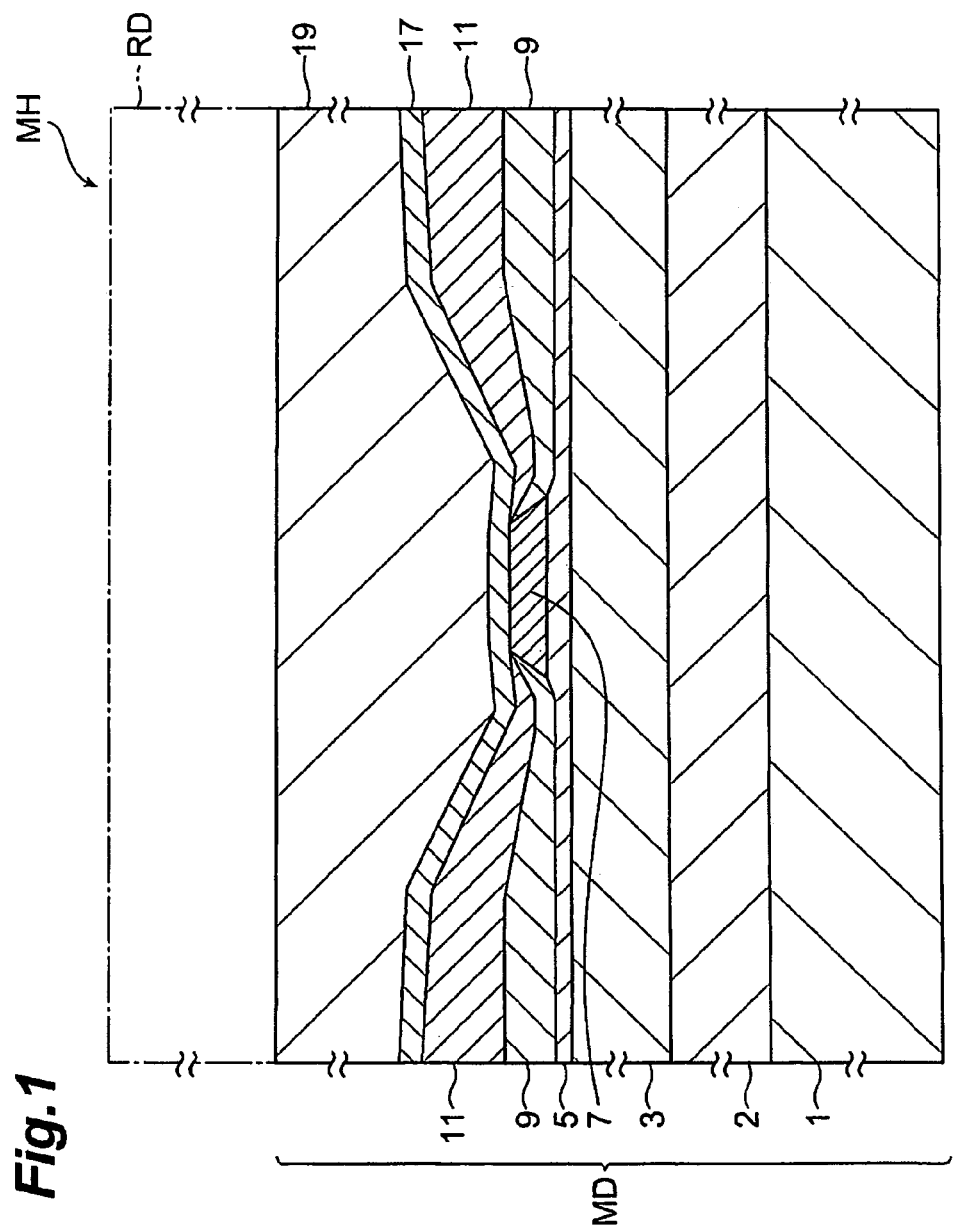
FIG. 1 is a schematic cross-sectional view for explaining the thin-film magnetic head in accordance with an embodiment.

FIG. 1 is a schematic sectional view for explaining a thin-film magnetic head MH. The thin-film magnetic head MH comprises a magnetism detection device MD as a reproducing head, and a magnetism forming device RD as a recording head. The magnetism detection device MD comprises a nonmagnetic substrate 1, a base layer 2, a lower magnetic shield layer 3 (first shield layer), a lower gap layer 5 (first insulating layer), a magnetoresistive film (hereinafter referred to as MR film) 7, domain control layers 9, electrode layers 11, an upper gap layer 17 (second insulating layer), an upper magnetic shield layer 19 (second shield layer), etc. FIG. 1 is a view showing the cross-sectional structure of the thin-film magnetic head MH as seen from the air bearing surface (a plane parallel to the laminating direction of the layers in the MR film 7).

The nonmagnetic substrate 1 is made of $Al_2O_3$.TiC or the like. The base layer 2 is made of $Al_2O_3$ or the like and is formed on the nonmagnetic substrate 1. The thickness of the base layer 2 is set to about 3 μm. The lower magnetic shield layer 3 is made of a soft magnetic substance such as NiFe, Sendust, FeCo, or FeCoNi, and is formed on the base layer 2. The thickness of the lower magnetic shield layer 3 is set to the range of 0.5 to 4 μm, e.g., about 3 μm. The lower gap layer 5 is made of a nonmagnetic insulator such as $Al_2O_3$, AlN, or $SiO_2$, and is formed on the lower magnetic shield layer 3. The thickness of the lower gap layer 5 is set to 5 to 25 nm.

Figure 2:
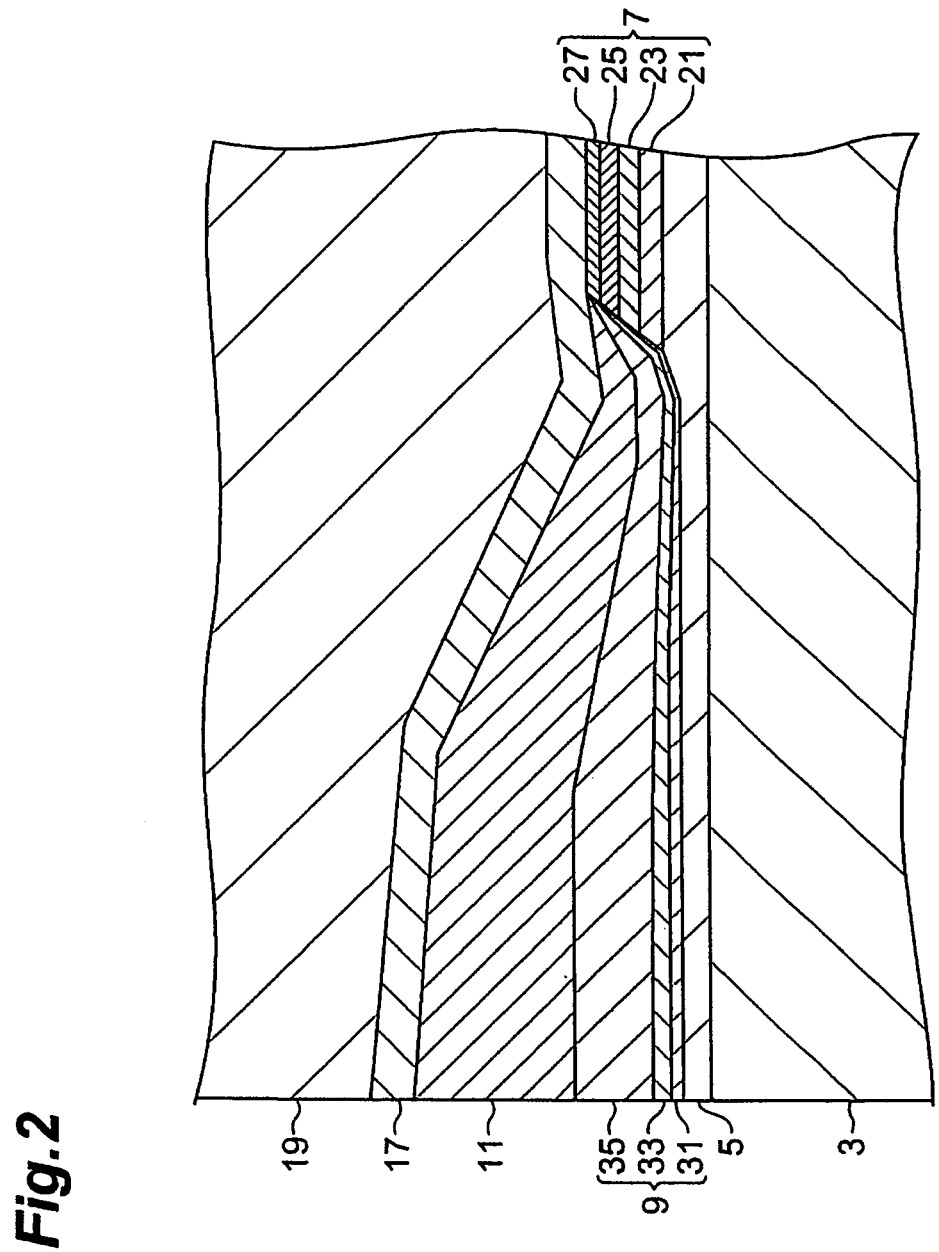
FIG. 2 is a schematic sectional view enlarging the MR film and domain control layer and their vicinity in the thin-film magnetic head in accordance with the embodiment.

The MR film 7 is a GMR (Giant MagnetoResistive) film, and includes a pinning layer (antiferromagnetic layer) 21, a pinned layer (fixed magnetic layer) 23, a nonmagnetic layer 25, and a free layer 27. FIG. 2 is a schematic sectional view enlarging the MR film 7 and domain control layer 9 and their vicinity in the thin-film magnetic head MH.

The MR film 7 is constructed by successively laminating a base layer (not depicted), the pinning layer 21, the pinned layer 23, the nonmagnetic layer 25, the free layer 27, and a cap layer (not depicted) in succession and patterning them (for which techniques such as ion milling and RIE can be utilized). Exchange coupling occurs in the interface between the pinning layer 21 and the pinned layer 23, whereby the direction of magnetization of the pinned layer 23 is fixed to a predetermined direction (a direction orthogonal to the track width direction). On the other hand, the direction of magnetization of the free layer 27 changes depending on a leakage magnetic field from the magnetic recording medium, i.e., an external magnetic field.

The pinning layer 21 is made of an antiferromagnetic substance such as PtMn or NiO, and is formed on the base layer (e.g., a film mainly made of Ta, Ni, Fe, Cr, or the like) formed on the lower gap layer 5. The pinned layer 23 is made of a ferromagnetic substance such as Fe, Co, Ni, NiFe, CoFe, CoZrNb, or FeCoNi, and is formed on the pinning layer 21. The nonmagnetic layer 25 is made of a nonmagnetic substance such as Cu, Ru, Rh, Ir, Au, or Ag, and is formed on the pinned layer 23. The free layer 27 is made of a ferromagnetic substance such as Fe, Co, Ni, NiFe, CoFe, CoZrNb, or FeCoNi, and is formed on the nonmagnetic layer 25. Formed on the MR film 7 is a protective layer (not depicted) which is made of Ta, $Al_2O_3$, or the like. The thickness of the MR film 7 is set to 15 to 45 nm.

A pair of domain control layers 9 are disposed on both sides of the track width direction of the MR film 7 so as to be separated from each other such that the MR film 7 is held therebetween, and apply a longitudinal magnetic field to the MR film (free layer 27). The direction of magnetization of the free layer 27 is parallel to the track width direction because of the longitudinal magnetic field from the domain control layers 9, and thus is a direction orthogonal to the direction of magnetization of the pinned layer 23.

As shown in FIG. 2, the MR film 7 is flanked by the domain control layers 9, each of which includes a layer structure constituted by the base layer 31, ferromagnetic layer 33, and hard magnetic layer 35. The domain control layers 9 may be disposed by way of a protective layer. The gap between the domain control layers 9 is set to 50 to 200 nm at their narrowest position.

The base layer 31 is used for causing the hard magnetic layer 35 to have a magnetization direction aligning with an in-plane direction, so as to enhance the coercive force of the hard magnetic layer 35. The in-plane direction is a direction extending along the hard magnetic layer 35 (i.e., a direction intersecting the laminating direction) In this embodiment, a material having a body-centered cubic (BCC) structure is used for the base layer 31. Examples of the material having a body-centered cubic structure used for the base layer 31 are metals selected from the group consisting of Ti, Cr, Mo, W, and their alloys. In this embodiment, the base layer 31 is formed from $CrTi_{15}$ (having a composition constituted by of 85 at % of Cr and 15 at % of Ti), for example.

The ferromagnetic layer 33 enhances the saturation magnetization of the domain control layer 9 as a whole, and a ferromagnetic material having a body-centered cubic structure is used therefor in this embodiment. Examples of the material having a body-centered cubic structure used for the ferromagnetic layer 33 are metals including at least one of Fe and Co. In this embodiment, the ferromagnetic layer 33 is formed from $FeCO_{10}$ (having a composition constituted by 90 at % of Fe and 10 at % of Co). The ferromagnetic layer 33 is formed on the base layer 31. The thickness of the ferromagnetic layer 33 is set to 1 to 10 nm.

The hard magnetic layer 35 is made of a hard magnetic layer containing Co, such as CoCrPt, CoPt, or CoTa, for example. In this embodiment, the hard magnetic layer 35 is formed from $CoCr_5 Pt_{15}$ (having a composition constituted by 80 at % of Co, 5 at % of Cr, and 15 at % of Pt). The hard magnetic layer 35 is formed on the ferromagnetic layer 33. Formed on the hard magnetic layer 35 is a protective layer (not depicted), which is made of Ta or the like. The thickness of the hard magnetic layer 35 is set to 10 to 50 nm.

A pair of electrode layers 11 are disposed on both sides in the track width direction of the MR film 7 so as to be separated from each other, and supply a current (sense current) to the MR film 7 (free layer 27). Each electrode layer 11 is made of a conductive material having a low resistance including Au, Ag, Ru, Rh, Cu, Cr, Mo, or the like, and is formed on the protective layer formed on the respective domain control layer 9. The thickness of the electrode layer 11 is set to 20 to 150 nm. Formed on the electrode layer 11 is a protective layer (not depicted), which is made of Ta, $Al_2O_3$, or the like. An electron supplied from one electrode layer 11 passes through the free layer 27 of the MR film 7, so as to be transmitted to the other electrode layer 11. A current flows in a direction opposite from that of the electron. The gap between the pair of electrode layers 11 is set to 20 to 500 nm at their narrowest position. The electric resistance of the electrode layer 11 is set lower than that of the domain control layer 9.

The upper gap layer 17 is made of a nonmagnetic insulating material such as $Al_2O_3$, AlN, or $SiO_2$. The upper gap layer 17 is formed on the protective layers formed on the MR film 7 and electrode layer 11. The thickness of the upper gap layer 17 is set to 5 to 25 nm.

The upper magnetic shield layer 19 is made of a soft magnetic substance such as NiFe, Sendust, FeCo, FeCoNi, or the like, and is formed on the upper gap layer 17. The thickness of the upper magnetic shield layer 19 is set to the range of 0.5 to 4 μm, e.g., about 2 μm. Since each of the shield layers 3, 19 is made of a soft magnetic material, the leakage magnetic field other than that from a magnetization transient area to be detected is restrained from being introduced into the MR film 7.

Here, the thickness of the base layer 31 will be studied. Under the influence of a shadow of a resist layer, the film-forming rate of the domain control layer (base layer 31, ferromagnetic layer 33, and hard magnetic layer 35) varies between a position near the MR film 7, and a position distanced from the MR film 7. Therefore, thicknesses of the base layer 31, ferromagnetic layer 33, and hard magnetic layer 35 are defined by their maximum values (maximum film thicknesses) at a position which is free from the influence of the shadow of the resist layer and is distanced from the MR film 7 as seen from the air bearing surface side.

Figure 3:
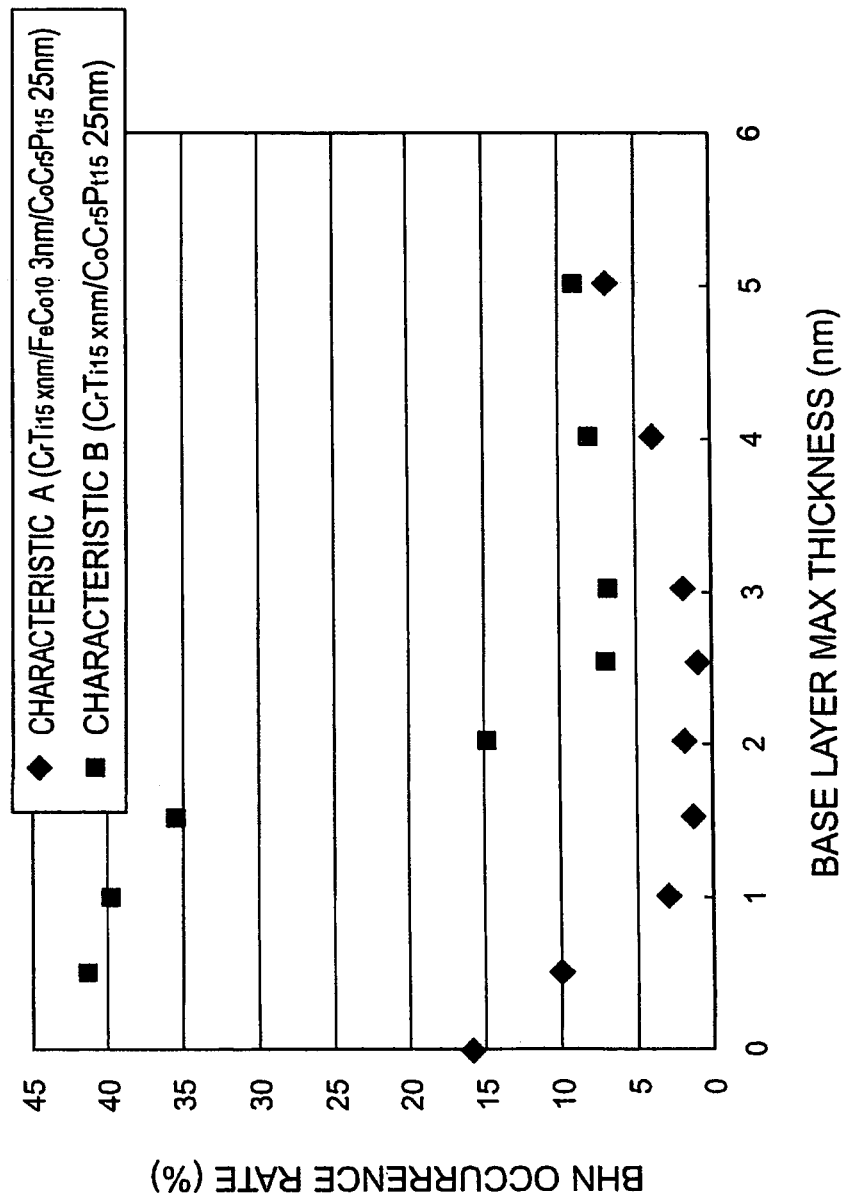
FIG. 3 is a chart showing the relationship between the maximum thickness of a base layer included in the domain control layers and the rate of occurrence of Barkhausen noise.

FIG. 3 shows characteristics of the rate of occurrence of Barkhausen noise (BHN) in a configuration using $CoCr_5Pt_{15}$ with a thickness (maximum film thickness) of 25 nm as the hard magnetic layer 35, and $CrTi_{15}$ as the base layer 31. FIG. 3 is a chart showing the relationship between the maximum film thickness of the base layer 31 and the rate of occurrence of Barkhausen noise. Characteristic A is a characteristic of the rate of occurrence of Barkhausen noise obtained when changing the thickness (maximum film thickness) of the base layer 31 as a parameter (x) in a configuration using $FeCO_{10}$ having a thickness (maximum film thickness) of 3 nm as the ferromagnetic layer 33 (a configuration in which the domain control layer 9 is a layer structure constituted by the base layer 31, ferromagnetic layer 33, and hard magnetic layer 35). Characteristic B is a characteristic of the rate of occurrence of Barkhausen noise obtained when changing the thickness (maximum film thickness) of the base layer 31 as a parameter (x) in a configuration having no ferromagnetic layer 33 (in a configuration in which the domain control layer 9 is a layer structure constituted by the base layer 31 and hard magnetic layer 35). The rate of occurrence of Barkhausen noise is a value obtained by measuring a certain number of minute devices having the same parameter, dividing the number of devices having generated Barkhausen noise by the measured number, and multiplying the resulting quotient by 100.

The basic configuration of the MR film 7 and the like was NiCr5/PtMn15/CoFe1.5/Ru0.8/CoFe2/Cu2/CoFe1/NiFe3/Ta2 (where the unit for numerals was mm). The configuration of the electrode films 11 was Ta5/Au50/Ta10 (where the unit for numerals was nm). The optical track width was 0.12 μm on average.

As can be seen from FIG. 3, the rate of occurrence of Barkhausen noise is lower in the configuration in which the domain control layer 9 has a layer structure of the base layer 31, ferromagnetic layer 33, and hard magnetic layer 35 than in the configuration in which the domain control layer 9 has a layer structure constituted by the base layer 31 and hard magnetic layer 35.

Also, as can be seen from FIG. 3, the rate of occurrence of Barkhausen noise is low when the thickness (maximum film thickness) of the base layer 31 falls within the range of 1 to 3 nm in the configuration in which the domain control layer 9 has a layer structure constituted by the base layer 31, the ferromagnetic layer 33, and the hard magnetic layer 35. This is because of the fact that, when the thickness of the base layer 31 is smaller than 1 nm, this layer is not sufficiently crystallized and thus fails to function as a base layer. When the thickness of the base layer 31 is greater than 3 nm, on the other hand, the gap between the MR film 7 and the hard magnetic layer 35 is increased by the base layer 31 existing therebetween, whereby the longitudinal magnetic field may not be applied appropriately.

In view of the foregoing, it will be preferred if the thickness (maximum film thickness) of the base layer 31 is set to the range of 1 to 3 nm.

Materials for the ferromagnetic layer 33 and hard magnetic layer 35 will now be explained with reference to FIG. 4.

Figure 4:
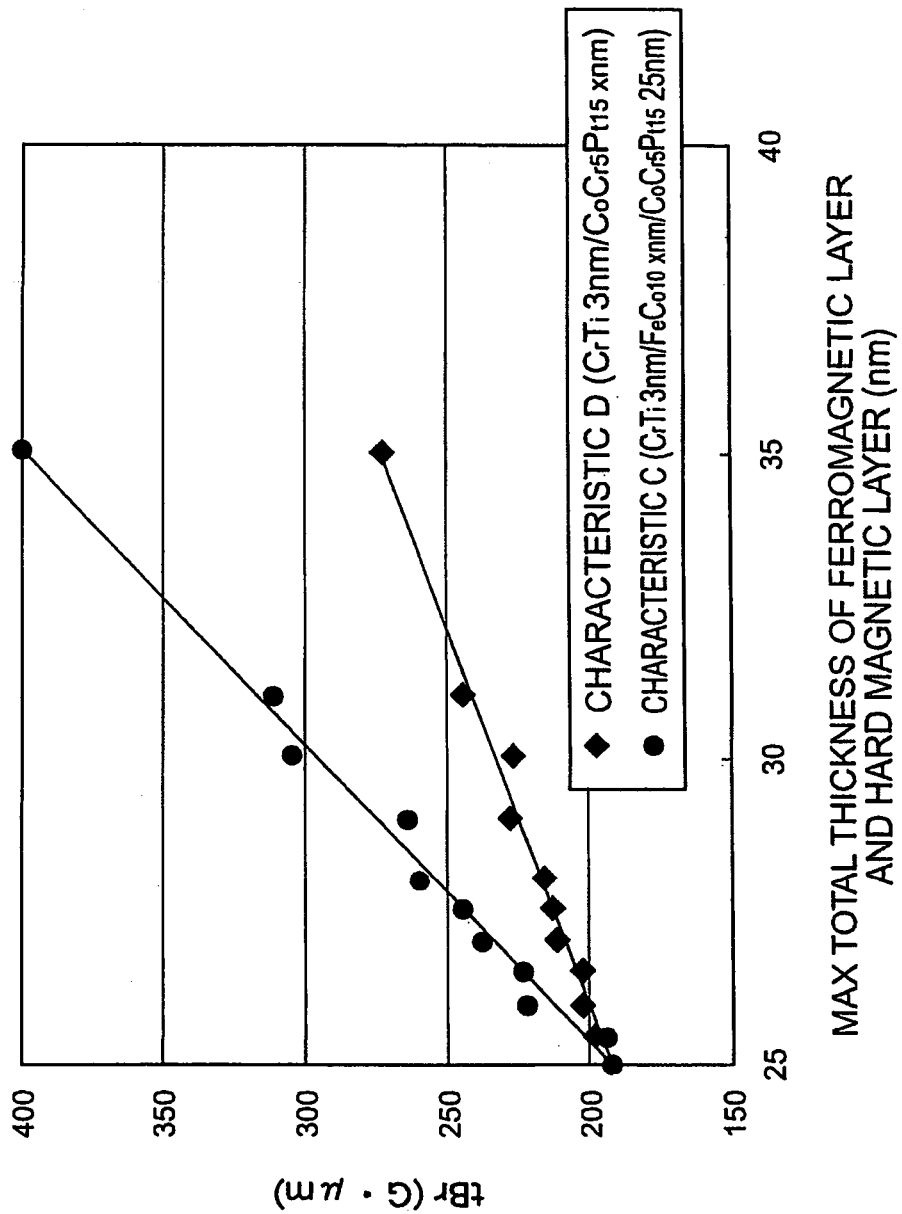
FIG. 4 is a chart showing the relationship between the maximum total film thickness of the ferromagnetic layer and hard magnetic layer included in the domain control layers and the product of remanent magnetization and film thickness.

FIG. 4 is a chart showing the relationship between the maximum total film thickness of the ferromagnetic layer 33 and hard magnetic layer 35 and the product (tBr) of remanent magnetization and film thickness. Characteristic C is a characteristic of the product of is remanent magnetization and film thickness obtained when changing the thickness (maximum film thickness) of the ferromagnetic layer 33 as a parameter (x) in a configuration using $CoCr_5 Pt_{15}$ having a thickness (maximum film thickness) of 25 nm for the hard magnetic layer 35, $FeCo_{10}$ for the ferromagnetic layer 33, and $CrTi_{15}$ having a thickness (maximum film thickness) of 3 nm for the base layer 31. Characteristic D is a characteristic of the product of remanent magnetization and film thickness obtained when changing the thickness (maximum film thickness) of the ferromagnetic layer 35 as a parameter (x) in a configuration using $CoCr_5Pt_{15}$ for the hard magnetic layer 35, and $CrTi_{15}$ having a thickness (maximum film thickness) of 3 nm for the base layer 31 (a configuration including no ferromagnetic layer 33).

For attaining a product of remanent magnetization and film thickness greater than that in the single layer of hard magnetic layer 35 when compared in terms of the maximum total film thickness excluding the base layer 31, it is necessary that a material yielding a product of remanent magnetization and film thickness not smaller than the product of remanent magnetization and film thickness in the hard magnetic layer 35 be chosen as a material used for the ferromagnetic layer 33 as shown in FIG. 4. Since the squareness ratio (remanent magnetic flux density/saturated magnetic flux density) of the domain control layer 9 is normally assumed to be near 1, it is necessary that a material by which the ferromagnetic layer 33 yields a saturation magnetization not smaller than that of the hard magnetic layer 35 be chosen as a material for the ferromagnetic layer 33 in terms of saturation magnetization Ms as well.

Though the above-mentioned terms "soft magnetic" and "hard magnetic" define magnitudes of coercive force, a layer may have materials or structures outside of the definition in microscopic or specific regions as long as it exhibits a function of "soft magnetic" or "hard magnetic" as a whole. For example, materials having magnetic characteristics different from each other may magnetically be exchange-coupled and those partly including a nonmagnetic substance may be used as long as they exhibit a soft magnetic or hard magnetic function as a whole.

Functions of the thin-film magnetic head MH will now be explained. The free layer 27 in the MR film 7 is turned into a single domain in the track width direction by the domain control layers 9. The direction of magnetization of the free layer 27 varies depending on the leakage magnetic field from a magnetization transient area, i.e., whether the magnetization transient area is the north pole or south pole. Since the direction of magnetization of the pinned layer 23 is fixed by the pinning layer 21, the transmission rate of electrons (current) between a pair of electrode layers 11 is changed by the change in resistance corresponding to the cosine between the respective directions of magnetization of the free layer 27 and pinned layer 23. When the change in current is detected, the leakage magnetic field from the magnetization transient area to be detected in the magnetic recording medium is detected. The magnetic field can also be detected by determining a voltage while keeping a supplied current (sense current) constant. The latter type of detection is used in general.

Magnetic recording of data will also be explained in brief here. A magnetic field forming device RD for writing magnetic data is mechanically coupled onto the magnetization detection device MD of the thin-film magnetic head MH. The writing into the magnetization transient area of the magnetic recording medium is carried out by the leakage magnetic field from the magnetic field forming device RD.

An example of method of manufacturing the thin-film magnetic head MH in accordance with this embodiment, the magnetism detection device MD in particular, will now be explained with reference to FIGS. 5 to 8. FIGS. 5 to 8 are views for explaining an example of method of manufacturing a magnetization detection device included in the thin-film magnetic head in accordance with this embodiment.

Figure 5:
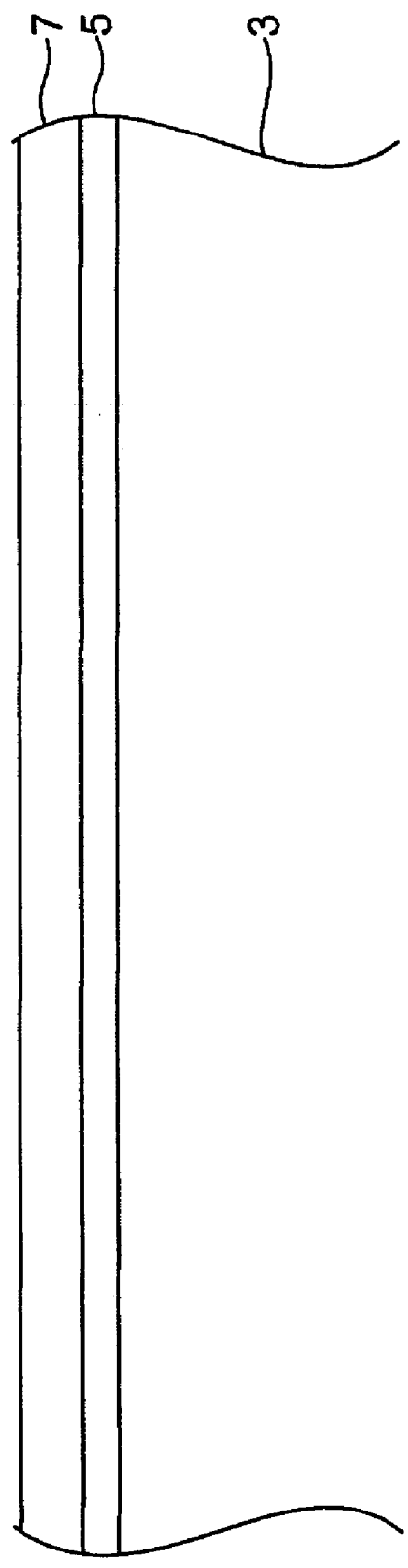
FIG. 5 is a view for explaining an example of the method of manufacturing a magnetism detection device included in the thin-film magnetic head in accordance with the embodiment.

First, as shown in FIG. 5, a lower magnetic shield layer 3, a lower gap layer 5, and an MR film 7 are successively formed on a nonmagnetic substrate (not depicted) until their predetermined thicknesses are attained. Wet plating can be used as a method of forming the lower magnetic shield layer 3, whereas sputtering can be used as a method of forming the lower gap layer 5 and MR film 7. In the wet plating, not only electroless plating using a solution containing a metal constituting a raw material, but also electroplating may be employed.

Figure 6:
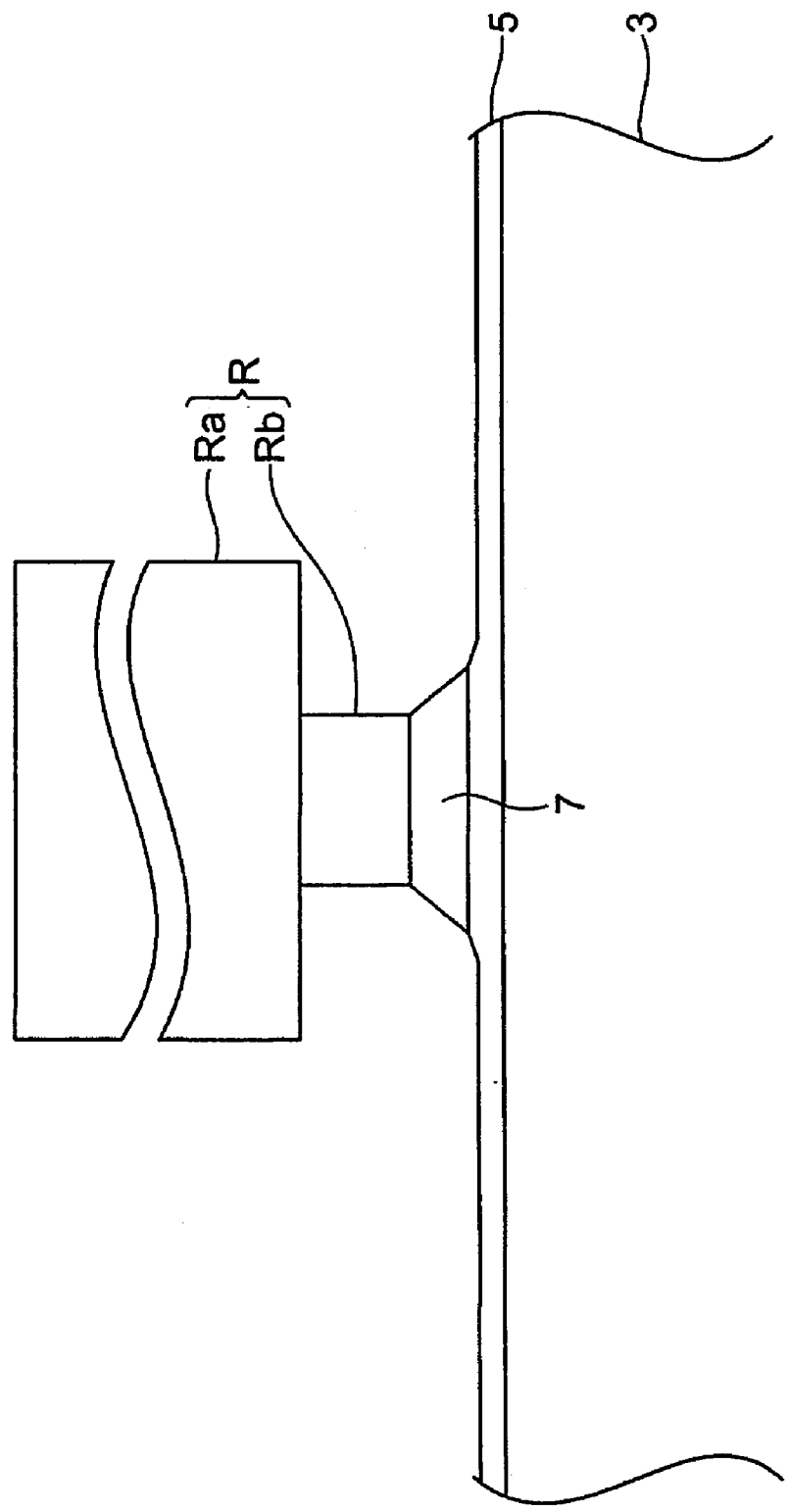
FIG. 6 is a view for explaining the example of the method of manufacturing a magnetism detection device included in the thin-film magnetic head in accordance with the embodiment.

Subsequently, as shown in FIG. 6, a resist layer R having a desirable pattern is formed on the MR film 7 formed by the process mentioned above. Then, using the resist layer R as a mask, the exposed area in the MR film 7 is eliminated from the front side to the surface of the lower gap layer 5, so as to leave the parts of MR film 7 masked by the resist layer R. Here, the front side part of the lower gap layer 5 may be eliminated as well. The gap between the remaining parts becomes an optical track width. For the elimination, an etching technique such as ion milling can be used.

In the resist layer R, its lower part Rb has a width (in the track width direction) smaller than the width of its upper part Ra (in the track width direction), so that an undercut is formed. As a method of forming the resist layer R, photolithography can be used. In this embodiment, the width of the lower part Rb of the resist layer R is set to about 50 nm, whereas the width of the upper part Ra is set to about 130 nm. Here, the resist layer R may have a bridge structure. In this case, the width of the lower part Rb becomes 0 nm.

Figure 7:
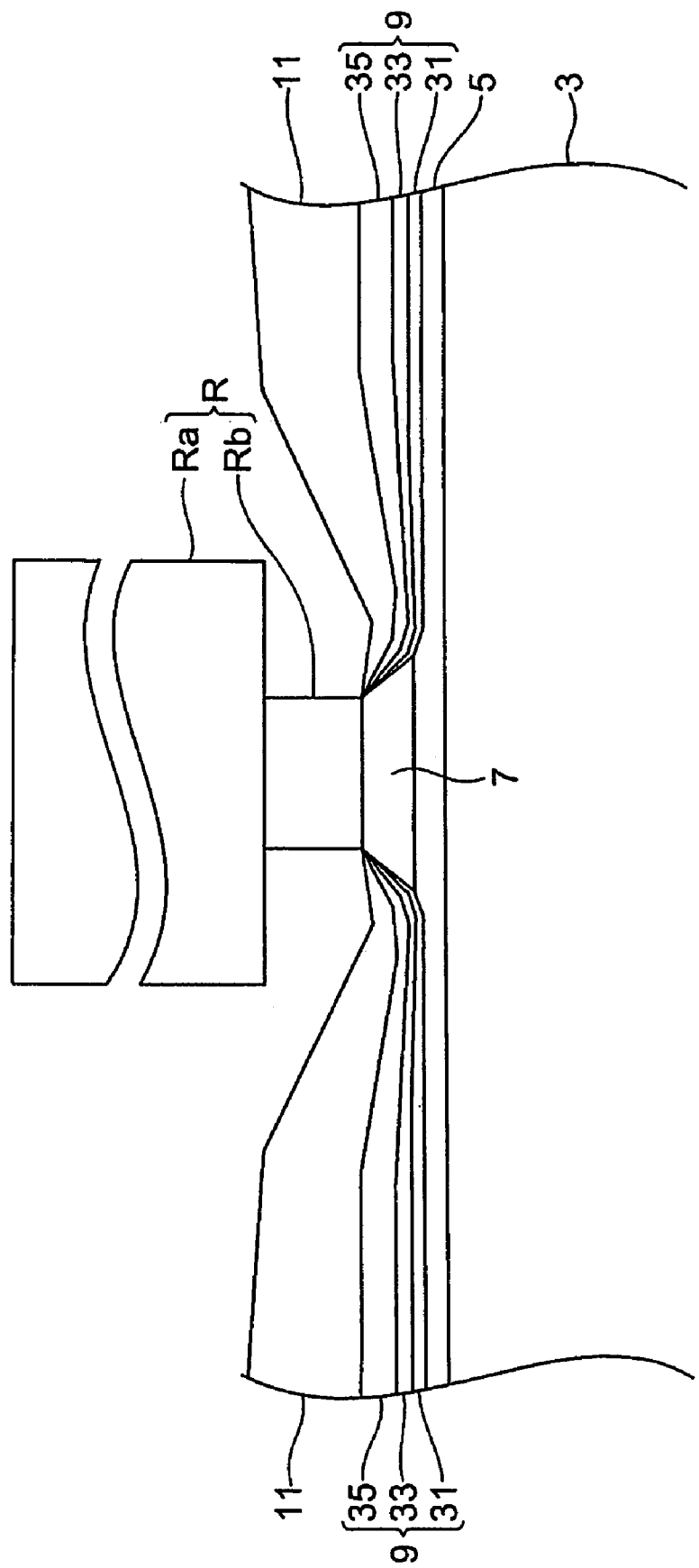
FIG. 7 is a view for explaining the example of the method of manufacturing a magnetism detection device included in the thin-film magnetic head in accordance with the embodiment.

Then, as shown in FIG. 7, a base layer 31 is successively formed on the lower gap layer 5 until a predetermined thickness is attained on both sides of the MR film 7 left by the process mentioned above, while using the resist layer R as a mask. As a method of forming the base layer 31, sputtering or PVD such as ion beam deposition can be used.

Next, as shown in FIG. 7, a ferromagnetic layer 33 is successively formed until a predetermined thickness is attained on the base layer 31 formed by the process mentioned above, while using the resist layer R as a mask. As a method of forming the ferromagnetic layer 33, sputtering or PVD such as ion beam deposition can be used.

Subsequently, as shown in FIG. 7, a hard magnetic layer 35 is successively formed until a predetermined thickness is attained on the ferromagnetic layer 33 formed by the process mentioned above, while using the resist layer R as a mask. This yields domain control layers 9 on both sides of the MR film 7. As a method of forming the hard magnetic layer 35, sputtering or PVD such as ion beam deposition can be used.

Then, as shown in FIG. 7, an electrode layer 11 is successively formed until a predetermined thickness is attained on the hard magnetic layer 35 formed by the process mentioned above, while using the resist layer R as a mask. As a method of forming the electrode layer 11, sputtering or PVD such as ion beam deposition can be used.

Thereafter, the resist layer R is removed (lifted off). This exposes the MR film 7.

Figure 8:
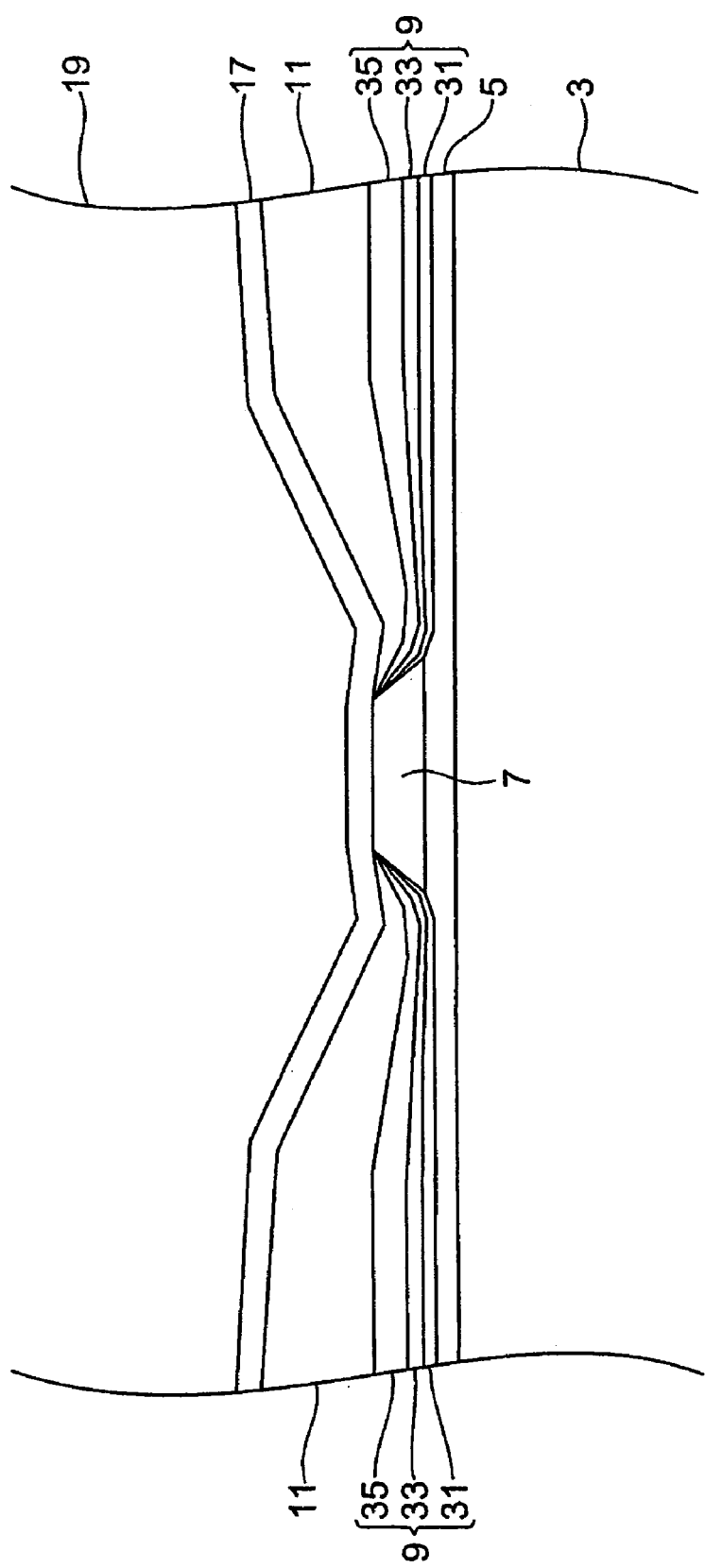
FIG. 8 is a view for explaining the example of the method of manufacturing a magnetism detection device included in the thin-film magnetic head in accordance with the embodiment.

Next, as shown in FIG. 8, an upper gap layer 17 and an upper magnetic shield layer 19 are successively formed until predetermined thicknesses are attained on the MR film 7 and electrode layer 11. This completes the magnetism detection device MD configured as shown in FIGS. 1 and 2. Sputtering can be used as a method of forming the upper gap layer 17, whereas plating can be used as a method of forming the upper magnetic shield layer 19.

Here, characteristics of coercive force of the domain control layer 9 were determined.

Figure 9:
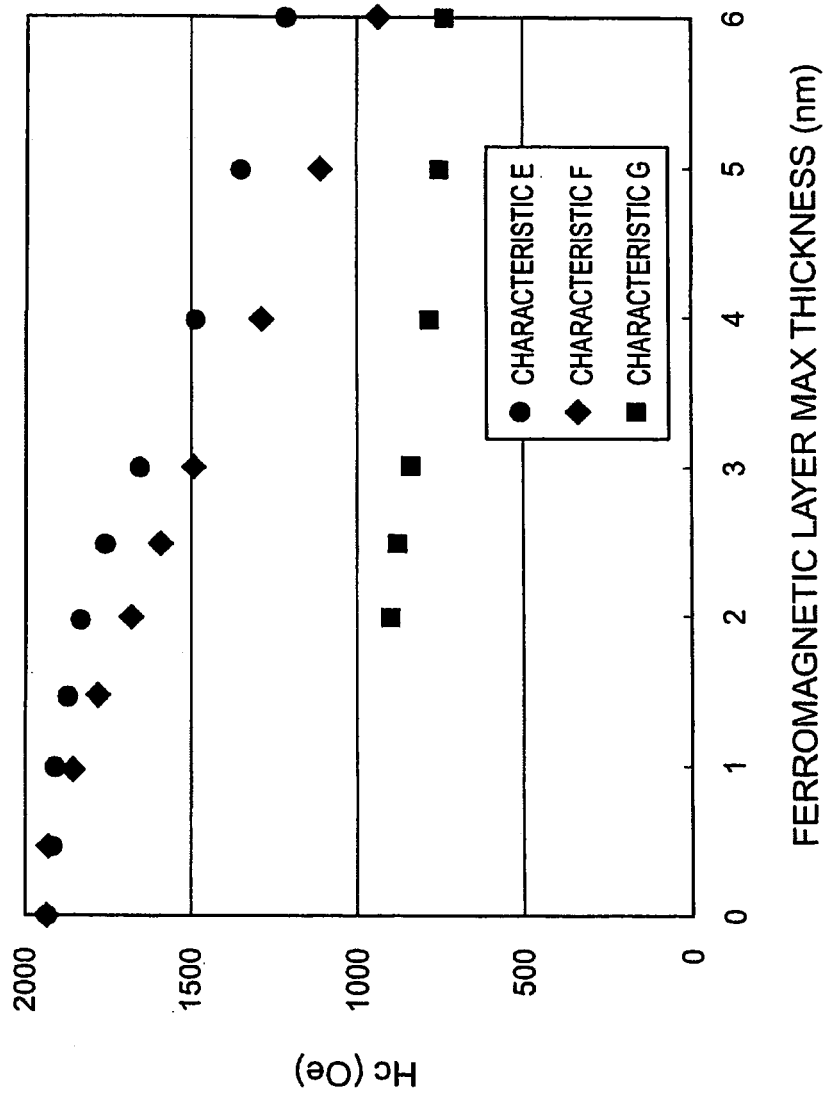
FIG. 9 is a chart showing the relationship between the maximum film thickness of the ferromagnetic film included in the domain control layer and the coercive force.

FIG. 9 shows characteristics of coercive force (Hc) in a configuration using $CoCr_5Pt_{15}$ with a thickness (maximum film thickness) of 25 nm as the hard magnetic layer 35, $FeCO_{10}$ as the ferromagnetic layer 33, and $CrTi_{15}$ having a thickness (maximum film thickness) of 2 nm as the base layer 31. FIG. 9 is a chart showing the relationship between the maximum film thickness of the ferromagnetic layer 33 and the coercive force. Characteristic E is the characteristic of coercive force in the layer structure constructed by laminating the base layer 31, ferromagnetic layer 33, and hard magnetic layer 35 in succession. Characteristic F is the characteristic of coercive force in the layer structure constructed by laminating the base layer 31, hard magnetic layer 35, and ferromagnetic layer 33 in succession. Characteristic G is the characteristic of coercive force in the layer structure constructed by laminating the ferromagnetic layer 33 and hard magnetic layer 35 in succession (in which the film thickness of the base layer 31 is zero).

As shown in FIG. 9, the layer structures including the base layer 31 yield higher coercive forces.

Also, the layer structure constructed by laminating the base layer 31, ferromagnetic layer 33, and hard magnetic layer 35 in succession yields a coercive force higher than that of the layer structure constructed by laminating the base layer 31, hard magnetic layer 35, and ferromagnetic layer 33 in succession. This seems to be because of the fact that the ferromagnetic layer 33 functions as with the base layer 31. Therefore, it is preferred that the ferromagnetic layer 33 use a ferromagnetic material having a body-centered cubic structure as with the base layer 31.

Subsequently, thin-film magnetic heads (magnetism detection devices) including domain control layers as in this embodiment were prepared, and their performances such as the ratio of occurrence of Barkhausen noise (BHN) were evaluated. Here, the ratio of occurrence of Barkhausen noise refers to the value obtained when the rate of occurrence of Barkhausen noise in the thin-film magnetic head in a configuration whose domain control layer has a base layer is divided by the rate of occurrence of Barkhausen noise in the thin-film magnetic head in a configuration whose domain control layer has no base layer.

The basic configuration of the MR film and the like was NiCr5/PtMn15/CoFe1.5/Ru0.8/CoFe2/Cu2/CoFe1/NiFe3/Ta2 (where the unit for numerals was nm). The configuration of the electrode layer was Ta5/Au50/Ta10 (where the unit for numerals was nm). The optical track width was 0.12 μm on average.

EVALUATION EXAMPLE 1

The rate of occurrence of Barkhausen noise was determined with a domain control layer having a layer structure constituted by a hard magnetic layer using $CoCr_5Pt_{15}$ with a thickness (maximum film thickness) of 25 nm, a ferromagnetic layer using $FeCo_{10}$ with a thickness (maximum film thickness) of 3 nm, and a base layer using $CrTi_{15}$ with a thickness (maximum film thickness) of 2 nm as shown in FIG. 10. Also, the rate of occurrence of Barkhausen noise was determined with a domain control layer having a layer structure constituted by a hard magnetic layer using $CoCr_5Pt_{15}$ with a thickness (maximum film thickness) of 25 nm and a ferromagnetic layer using $FeCo_{10}$ with a thickness (maximum film thickness) of 3 nm. From thus determined rates, the ratio of occurrence of Barkhausen noise was obtained.

The ratio of occurrence of Barkhausen noise was 0.13 as shown in FIG. 10. Hence, it was verified that the domain control layer having the layer structure constituted by the hard magnetic layer, ferromagnetic layer, and base layer could lower the ratio of occurrence of Barkhausen noise.

EVALUATION EXAMPLE 2

The rate of occurrence of Barkhausen noise was determined with a domain control layer having a layer structure constituted by a hard magnetic layer using $CoCr_5Pt_{15}$ with a thickness (maximum film thickness) of 25 nm, a ferromagnetic layer using $FeCO_{10}$ with a thickness (maximum film thickness) of 3 nm, and a base layer using $TiW_{75}$ (having a composition constituted by 25 at % of Ti and 75 at % of W) with a thickness (maximum film thickness) of 2 nm as shown in FIG. 10. Also, the rate of occurrence of Barkhausen noise was determined with a domain control layer having a layer structure constituted by a hard magnetic layer using $CoCr_5Pt_{15}$ with a thickness (maximum film thickness) of 25 nm and a ferromagnetic layer using $FeCo_{10}$ with a thickness (maximum film thickness) of 3 nm. From thus determined rates, the ratio of occurrence of Barkhausen noise was obtained.

The ratio of occurrence of Barkhausen noise was 0.23 as shown in FIG. 10. Hence, it was verified that the domain control layer having the layer structure constituted by the hard magnetic layer, ferromagnetic layer, and base layer could lower the ratio of occurrence of Barkhausen noise.

EVALUATION EXAMPLE 3

The rate of occurrence of Barkhausen noise was determined with a domain control layer having a layer structure constituted by a hard magnetic layer using $CoCr_5Pt_{15}$ with a thickness (maximum film thickness) of 25 nm, a ferromagnetic layer using $FeCO_{10}$ with a thickness (maximum film thickness) of 3 nm, and a base layer using $CrMo_{20}$ (having a composition constituted by 80 at % of Cr and 20 at % of Mo) with a thickness (maximum film thickness) of 2 nm as shown in FIG. 10. Also, the rate of occurrence of Barkhausen noise was determined with a domain control layer having a layer structure constituted by a hard magnetic layer using $CoCr_5Pt_{15}$ with a thickness (maximum film thickness) of 25 nm and a ferromagnetic layer using $FeCo_{10}$ with a thickness (maximum film thickness) of 3 nm. From thus determined rates, the ratio of occurrence of Barkhausen noise was obtained.

The ratio of occurrence of Barkhausen noise was 0.55 as shown in FIG. 10. Hence, it was verified that the domain control layer having the layer structure constituted by the hard magnetic layer, ferromagnetic layer, and base layer could lower the ratio of occurrence of Barkhausen noise.

EVALUATION EXAMPLE 4

The rate of occurrence of Barkhausen noise was determined with a domain control layer having a layer structure constituted by a hard magnetic layer using $CoCr_5Pt_{15}$ with a thickness (maximum film thickness) of 25 nm, a ferromagnetic layer using $FeCo_{10}$ with a thickness (maximum film thickness) of 3 nm, and a base layer using $CrW_{20}$ (having a composition constituted by 80 at % of Cr and 20 at % of W) with a thickness (maximum film thickness) of 2 nm as shown in FIG. 10. Also, the rate of occurrence of Barkhausen noise was determined with a domain control layer having a layer structure constituted by a hard magnetic layer using $CoCr_5Pt_{15}$ with a thickness (maximum film thickness) of 25 nm and a ferromagnetic layer using $FeCo_{10}$ with a thickness (maximum film thickness) of 3 nm. From thus determined rates, the ratio of occurrence of Barkhausen noise was obtained.

The ratio of occurrence of Barkhausen noise was 0.24 as shown in FIG. 10. Hence, it was verified that the domain control layer having the layer structure constituted by the hard magnetic layer, ferromagnetic layer, and base layer could lower the ratio of occurrence of Barkhausen noise.

In this embodiment, as in the foregoing, the domain control layer 9 includes a layer structure constituted by the hard magnetic layer 35, ferromagnetic layer 33, and base layer 31, whereby the base layer 31 causes the hard magnetic layer 35 to have a direction of magnetization aligning with an in-plane direction. This can enhance the coercive force of the hard magnetic layer 35, thereby further effectively suppressing the occurrence of Barkhausen noise.

In this embodiment, the base layer 31, ferromagnetic layer 33, and hard magnetic layer 35 are formed in this order, whereas the ferromagnetic layer 33 is laminated between the hard magnetic layer 35 and base layer 31. This can further enhance the coercive force of the hard magnetic layer 35.

In this embodiment, the base layer 31 includes a material having a body-centered cubic structure. This allows the hard magnetic layer 35 to be formed while growing with its direction of magnetization aligning with an in-plane direction. This point will now be explained in detail. Co alloys such as CoCrPt, CoPt, and CoTa have a hexagonal close-packed (HCP) structure. A substance having a hexagonal close-packed structure usually orients its c axis to a perpendicular direction (a direction intersecting a plane extending along the material layer) or attains a non-orientated state so as to become more stable in terms of energy. For exhibiting a high coercive force within a plane, however, it is necessary for a magnetic material having a hexagonal close-packed structure to have an orientation such as (110), (100), or (101). In a substance having a body-centered cubic structure either in (100) or (110) orientation, a magnetic material having a hexagonal close-packed structure epitaxially grows on the substance, thus yielding a high coercive force within a plane.

In this embodiment, the base layer 31 is formed from a metal selected from the group consisting of Ti, Cr, Mo, W, and their alloys. This allows the hard magnetic layer 35 to be formed while growing with its direction of magnetization aligning with an in-plane direction. The metal selected from the group consisting of Ti, Cr, Mo, W, and their alloys has a body-centered cubic structure.

In this embodiment, the maximum film thickness of the base layer 31 is set to the range of 1 to 3 nm. This can suppress the occurrence of Barkhausen noise quite effectively.

A head gimbal assembly using the above-mentioned thin-film magnetic head MH will now be explained.

Figure 11:
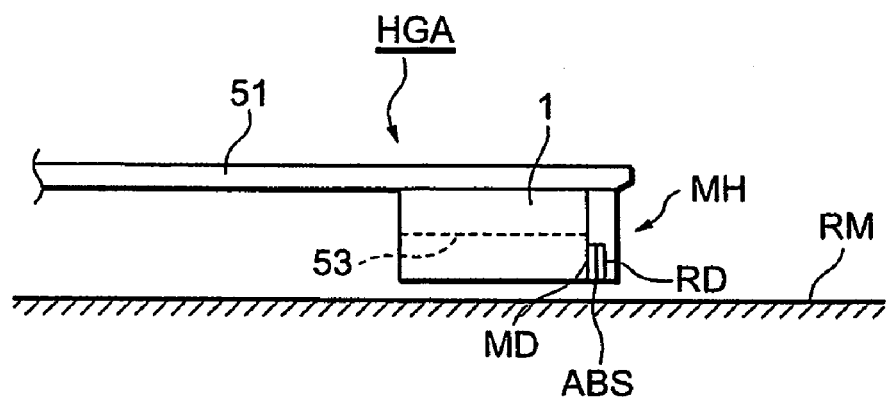
FIG. 11 is a side view of a main part of a head gimbal assembly.

FIG. 11 is a side view of a main part of a head gimbal assembly HGA. The head gimbal assembly HGA comprises the thin-film magnetic head MH in accordance with the above-mentioned embodiment as its thin-film magnetic head.

This head gimbal assembly HGA further comprises a flexible member 51 (gimbal) in addition to the thin-film magnetic head MH. The flexible member 51 can flex within a plane including its longitudinal and thickness directions. The thin-film magnetic head MH is attached to the flexible member 51 such that the laminating direction of the layers in the MR film 7 and the longitudinal direction substantially coincide with each other. The thin-film magnetic head MH is a functional device using the nonmagnetic substrate 1 as a slider. The slider 1 (support) has a groove 53 extending along the laminating direction of the layers in the MR film 7. The groove 53 defines an aerodynamic characteristic when the thin-film magnetic head MH floats up.

The flexible member 51 to which the thin-film magnetic head MH is attached flexes in the thickness direction because of a force received by the thin-film magnetic head MH. The laminating direction of layers in the MR film 7 (longitudinal direction of the flexible member 51) substantially coincides with the track circumferential direction formed by a series of magnetization transient areas of the recording medium.

A hard disk drive HD using the above-mentioned thin-film magnetic head MH (head gimbal assembly HGA) will now be explained.

Figure 12:
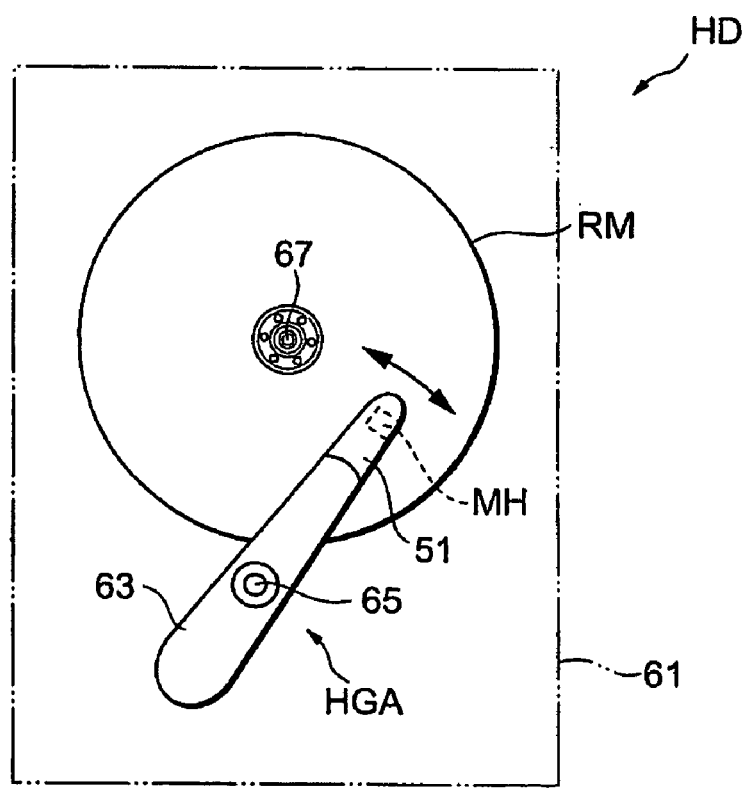
FIG. 12 is a plan view of a hard disk drive using the head gimbal assembly shown in FIG. 11.

FIG. 12 is a plan view of the hard disk drive HD. The hard disk drive HD comprises a housing 61. Within the housing 61, a magnetic recording medium RM is disposed in addition to the head gimbal assembly HGA having the thin-film magnetic head MH. The head gimbal assembly HGA is a head gimbal assembly having an arm 63 to which one longitudinal end part of the flexible member 51 is secured. As the arm 63 rotates about a rotary shaft 65 disposed near the center part, the thin-film magnetic head MH moves radially of the magnetic recording medium RM. The magnetic recording medium RM is shaped like a disk having a track formed by a series of magnetization transient areas extending along its circumferential direction. As the magnetic recording medium RM rotates about a rotary shaft 67 disposed at the center of the disk, the magnetization transient areas move relative to the thin-film magnetic head MH.

The thin-film magnetic head MH (MR film 7) is disposed such that a surface parallel to the laminating direction of layers in the MR film 7 opposes the magnetic recording medium RM, and thus can detect leakage magnetic fields from the magnetization transient areas. The surface parallel to the laminating direction of layers in the MR film 7 becomes an air bearing surface ABS. Here, longitudinal magnetic recording, perpendicular magnetic recording, and the like can be used as a recording scheme for the magnetic recording medium RM.

As in the foregoing, the head gimbal assembly HGA and hard disk drive HD can suppress the occurrence of Barkhausen noise further effectively, since their thin-film magnetic head is the thin-film magnetic head MH of the above-mentioned embodiment.

The present invention should not be limited to the above-mentioned embodiment. For example, each layer is not required to be made of a single material, but may be formed from a plurality of materials as long as they can exhibit a predetermined function as a whole. The materials may be an alloy, a mixture, or a combination of layer structures. Other layers may be interposed between these layers as well.

Though the thin-film magnetic head MH comprises the magnetism detection device MD as a reproducing head and the magnetic field forming device RD as a recording head in the above-mentioned embodiment, the thin-film magnetic head may comprise the magnetism detection device MD alone.

Though the base layer 31 is formed so as to extend to the side face of the MR film 7, it is not always necessary to do so. The base layer 31 may be formed on the lower gap layer 5 alone.

As explained in the foregoing in terms of preferred embodiments, the present invention can provide a thin-film magnetic head which can suppress the occurrence of Barkhausen noise more effectively, and a head gimbal assembly and a hard disk drive which are equipped with the thin-film magnetic head.

What is claimed is:

1. A thin-film magnetic head comprising:
    a magnetoresistive film; and
    a pair of domain control layers, disposed on both sides in a track width direction of the magnetoresistive film while being separated from each other, for applying a bias magnetic field to the magnetoresistive film;
    wherein the domain control layers include a layer structure constituted by a hard magnetic layer, a ferromagnetic layer, and a base layer for causing the hard magnetic layer to have a magnetization direction aligning with an in-plane direction,
    wherein the ferromagnetic layer is provided between the hard magnetic layer and the base layer in the layer structure, and
    wherein the ferromagnetic layer includes a material having a body-centered cubic structure.

2. The thin-film magnetic head according to claim 1, wherein the base layer includes a material having a body-centered cubic structure.

3. The thin-film magnetic head according to claim 1, wherein the base layer contains a metal selected from the group consisting of Ti, Cr, Mo, W, and alloys thereof.

4. The thin-film magnetic head according to claim 1, wherein the base layer has a thickness set to the range of 1 to 3 nm.

5. The thin-film magnetic head according to claim 1, wherein the hard magnetic layer comprises a hard magnetic material containing Co.

6. The thin-film magnetic head according to claim 1, wherein the ferromagnetic layer comprises a metal containing at least one of Fe and Co.

7. A head gimbal assembly comprising a support, a thin-film magnetic head formed on the support, and a gimbal for securing the support;
    wherein the thin-film magnetic head comprises:
    a magnetoresistive film; and
    a pair of domain control layers, disposed on both sides in a track width direction of the magnetoresistive film while being separated from each other, for applying a bias magnetic field to the magnetoresistive film;
    wherein the domain control layers include a layer structure constituted by a hard magnetic layer, a ferromagnetic layer, and a base layer for causing the hard magnetic layer to have a magnetization direction aligning with an in-plane direction,
    wherein the ferromagnetic layer is provided between the hard magnetic layer and the base layer in the layer structure, and
    wherein the ferromagnetic layer includes a material having a body-centered cubic structure.

8. A hard disk drive comprising a support, a thin-film magnetic head formed on the support, and a recording medium opposing the thin-film magnetic head;
    wherein the thin-film magnetic head comprises:
    a magnetoresistive film; and
    a pair of domain control layers, disposed on both sides in a track width direction of the magnetoresistive film while being separated from each other, for applying a bias magnetic field to the magnetoresistive film; and
    wherein the domain control layers include a layer structure constituted by a hard magnetic layer, a ferromagnetic layer, and a base layer for causing the hard magnetic layer to have a magnetization direction aligning with an in-plane direction,
    wherein the ferromagnetic layer is provided between the hard magnetic layer and the base layer in the layer structure, and
    wherein the ferromagnetic layer includes a material having a body-centered cubic structure.

* * * * *